United States Patent
Wu

(10) Patent No.: US 8,329,535 B2
(45) Date of Patent: Dec. 11, 2012

(54) MULTI-LEVEL-CELL TRAPPING DRAM

(75) Inventor: Chao-I Wu, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 440 days.

(21) Appl. No.: 11/761,344

(22) Filed: Jun. 11, 2007

(65) Prior Publication Data

US 2008/0304318 A1    Dec. 11, 2008

(51) Int. Cl.
 *H01L 21/336* (2006.01)
(52) U.S. Cl. ........ 438/257; 438/177; 438/288; 257/316; 257/368; 257/E21.18; 257/E21.21; 257/E21.423; 365/159; 365/174
(58) Field of Classification Search .............. 438/117, 438/200, 267, 257, 288; 257/314, 316, 368, 257/410, 411, E21.18, E21.21, E21.423, 257/E21.679, E21.68; 365/159, 174, 185.19
See application file for complete search history.

(56) References Cited

U.S. PATENT DOCUMENTS

| | | | | |
|---|---|---|---|---|
| 5,633,178 A * | 5/1997 | Kalnitsky | ............... | 438/288 |
| 7,209,390 B2 * | 4/2007 | Lue et al. | ............... | 365/185.19 |
| 7,510,935 B2 * | 3/2009 | Lee et al. | ............... | 438/261 |
| 2004/0238855 A1 * | 12/2004 | King | ............... | 257/213 |
| 2005/0253133 A1 * | 11/2005 | King | ............... | 257/25 |
| 2005/0286287 A1 * | 12/2005 | Park et al. | ............... | 365/63 |
| 2005/0286312 A1 * | 12/2005 | Wu et al. | ............... | 365/185.29 |
| 2006/0007742 A1 * | 1/2006 | Yeh | ............... | 365/185.18 |
| 2006/0291287 A1 * | 12/2006 | Furnemont | ............... | 365/185.18 |
| 2007/0296025 A1 * | 12/2007 | Matsumoto et al. | ............... | 257/324 |
| 2009/0140322 A1 * | 6/2009 | Nakagawa et al. | ............... | 257/324 |

OTHER PUBLICATIONS

EEPROM definition from http://searchcio-midmarket.techtarget.com/sDefinition/0,,sid183_gci213928,00.html.*

* cited by examiner

*Primary Examiner* — Olik Chaudhuri
*Assistant Examiner* — Su Kim
(74) *Attorney, Agent, or Firm* — Jianq Chyun IP Office

(57) ABSTRACT

A memory device having at least one multi-level memory cell is disclosed, and each multi-level memory cell configured to store n multiple bits, where n is an integer, wherein the multiple bits are stored in a charge storage layer trapping charge carriers injected by application of a voltage to set or reset a threshold voltage $V_t$ of the memory cell to one of $2^n$ levels. Each memory cell may be programmed to one of $2^n$ multiple levels, wherein each level represents n multiple bits.

13 Claims, 8 Drawing Sheets

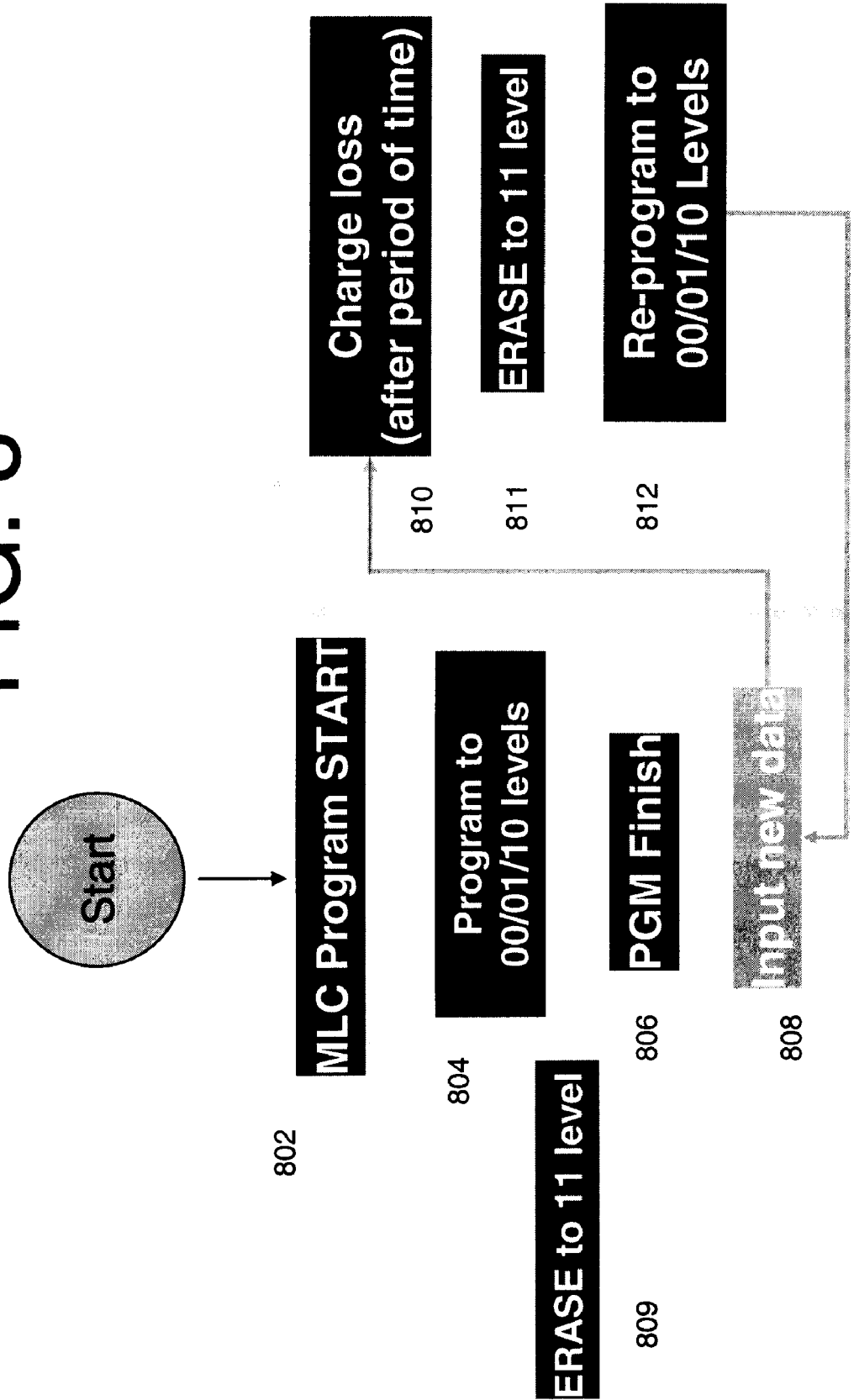

and a capacitor 103. The
MULTI-LEVEL-CELL TRAPPING DRAM

CROSS-REFERENCE TO RELATED APPLICATIONS

COPYRIGHT NOTICE

A portion of the disclosure of this patent document contains material which may be subject to copyright protection. The copyright owner has no objection to the facsimile reproduction by anyone of the patent document or the patent disclosure as it appears in the Patent and Trademark Office patent file or records, but otherwise reserves all copyright rights.

TECHNICAL FIELD

The invention relates to memory devices, and more particularly to a multi-level-cell trapping dynamic random access memory (DRAM).

BACKGROUND

Dynamic random access memory (DRAM) is a major semiconductor product and is utilized in computer core memory and many other consumer devices. Two commonly used layout designs for DRAM memory cells are planar and stacked. In a planar memory cell structure, the cell is built up from the substrate. The cell's capacitor is formed by a dielectric silicon dioxide layer that is laid down between the polysilicon cell plate and the substrate. In a stacked memory cell structure, the cell is built up from the substrate as in the planar memory cell structure. The dielectric layer is partially sandwiched between two layers of polysilicon, yielding a large capacitive surface.

FIG. 1 illustrates a prior art planar capacitor DRAM structure 100 having a 1-bit memory cell. The memory structure 100 includes a MOS transistor 101 and a capacitor 103. The memory structure 100 includes a p-type substrate 102 having n+ dopant diffused areas 105. A tunnel oxide layer 104 is formed over p-type substrate 102 above the n+ dopant areas that function as a source 105a and a drain 105b for MOS transistor 101. A polysilicon layer 106 is formed over the tunnel oxide layer 104. A first portion of the polysilicon layer 106a functions as a control gate for MOS transistor 101. A second portion of the polysilicon layer 106b forms part of the storage capacitor 103. The memory structure 100 may be arranged in one or more arrays. In such an arrangement, each capacitor 103 functions as a memory storage element capable of storing one memory bit. Each MOS transistor 101 controls writing, erasing, and reading of the memory storage element through connections to word lines, bit lines, and sense amplifiers (not shown) as is well known. Because of increased density requirements in consumer electronics, there is a need for memory devices to occupy less space on memory chips. However, there is a lower bound on the size of the storage capacitor in light of issues of data detection and retention, so that increasing density using conventional DRAM designs is very difficult.

FIG. 2 illustrates a prior art stacked capacitorless silicon on insulator (SOI) trapping DRAM (TDRAM) memory structure 200 having a 1-bit memory cell. The memory structure 200 includes a p-type substrate 202. An oxide layer 204, such as $SiO_2$ is formed over the p-type substrate 202, and a silicon layer 206 is formed over the oxide layer 204 to complete the SOI (or silicon-insulator-silicon) layered structure. The silicon layer 206 includes n+ dopant diffused areas 205 that function as a source 205a and a drain 205b. An oxide layer 208 is formed over the silicon layer 206, and a gate oxide layer 210 is formed above the oxide layer 208. The gate oxide layer 210 functions as a control gate. In operation, control voltages are applied to the control gate, source, and drain to inject into or remove charge carriers from the silicon layer 206. Charge is "trapped" in the silicon layer 206, rather than being stored in a storage capacitor. The silicon layer 206 (or "floating body") functions as a charge storage layer. The SOI layered structure of memory structure 200 may be formed, for example, using an oxygen ion beam implantation process to create a buried $SiO_2$ layer. Alternatively, a wafer bonding process or any one of a number of other methods known in the art may be used. The capacitorless SOI structure 200 requires less space than the conventional planar capacitor DRAM structure 100 of FIG. 1, but there is a need for a memory structure having a simpler fabrication process. Also, because of increased density requirements in consumer electronics, there is a need for memory devices to store more than 1-bit of data per memory cell.

FIG. 3 illustrates a prior art metal-oxide-nitride-nitride-silicon (MONNS) memory structure 300 for a floating-gate EEPROM flash memory having a 1-bit memory cell. The memory structure 300 includes a p-type substrate 302 having n+ dopant diffused areas 303 which function as a source 303a and a drain 303b. A first nitride layer 304, such as silicon nitride (SiN), is formed over the p-type substrate 302. A second nitride layer 306, such as silicon nitride (SiN), is formed over the first nitride layer 304. An oxide layer 308 is formed over the second nitride layer 306. A metal layer 310 is formed over the oxide layer 308. In operation, the second nitride layer 306 acts as the charge trapping and storage layer, while the first nitride layer 304 simply acts as a low barrier height (LBH) dielectric layer. The MONNS flash memory structure 300 has a simpler fabrication process than the capacitorless SOI TDRAM structure 200 of FIG. 2. However, it is not suited for high-speed memory applications such as DRAM. Also, because of increased density requirements in consumer electronics, there is a need for memory devices to store more than 1-bit of data per memory cell.

SUMMARY

According to one aspect of the invention, a trapping dynamic random access memory device is disclosed that includes at least one multi-level memory cell. Each multi-level memory cell is configured to store n multiple bits, where n is an integer, wherein the multiple bits are stored by trapping charge carriers in a charge storage layer, the charge carriers being injected by application of a voltage to set or reset a threshold voltage $V_t$ of the memory cell to one of $2^n$ levels. According to another aspect of the invention, a trapping dynamic random access memory device is disclosed that includes a plurality of multi-level memory cells. Each multi-level memory cell has a control gate and a charge storage layer for storing n multiple bits, where n is an integer, the charge storage layer trapping charge carriers injected by application of a voltage to set or reset a threshold voltage $V_t$ of the memory cell to one of $2^n$ levels. The memory device further includes a plurality of word lines and bit lines coupled to the control gates and the charge storage layers of the memory cells.

According to another aspect of the invention, a method for making a multi-level cell trapping dynamic random access memory device is disclosed. Source and drain areas are formed in a substrate. A charge storage layer is formed over the substrate. An insulating layer is formed over the charge storage layer. A polysilicon layer is formed over the insulating layer.

According to another aspect of the invention, methods for programming, erasing, and reprogramming a trapping dynamic random access memory device having a multi-level memory cell configured to store n multiple bits in a charge storage layer, where n is an integer, the charge storage layer trapping charge carriers injected by application of a voltage to set or reset a threshold voltage $V_t$ of the memory cell to one of $2^n$ levels, the memory cell being controlled by a polysilicon control gate are disclosed. The memory cell is programmed to a first one of $2^n$ multiple levels representing n multiple bits by applying a first voltage to the control gate. The memory cell is reprogrammed to the first one of $2^n$ multiple levels after a period of time to refresh the memory cell. The memory cell is erased by programming the memory cell to a second one of $2^n$ multiple levels representing an erased state of the memory cell by applying a second voltage to the control gate. Erasing the memory cell can occur before reprogramming the memory cell, or it may occur after reprogramming the memory cell in order to store new n multiple bits.

BRIEF DESCRIPTION OF DRAWINGS

The foregoing summary, as well as the following detailed description, will be better understood when read in conjunction with the appended, exemplary drawings. It should be understood, however, that the invention is not limited to the precise arrangements and instrumentalities shown. In the drawings:

FIG. 8 is a flow diagram illustrating an example of a method for programming, refreshing, and erasing data in a multi-level-cell trapping DRAM.

DETAILED DESCRIPTION

Reference will now be made in detail to exemplary embodiments of the invention, examples of which are illustrated in the accompanying drawings. Wherever possible, the same reference numbers will be used throughout the drawings to refer to the same. The following examples overcome disadvantages of the prior art memory devices by providing a more compact cell structure capable of storing a high density of bits by using a multi-level-cell structure, a simplified fabrication process, and a faster response time for programming and erasing operations.

Figure 1:
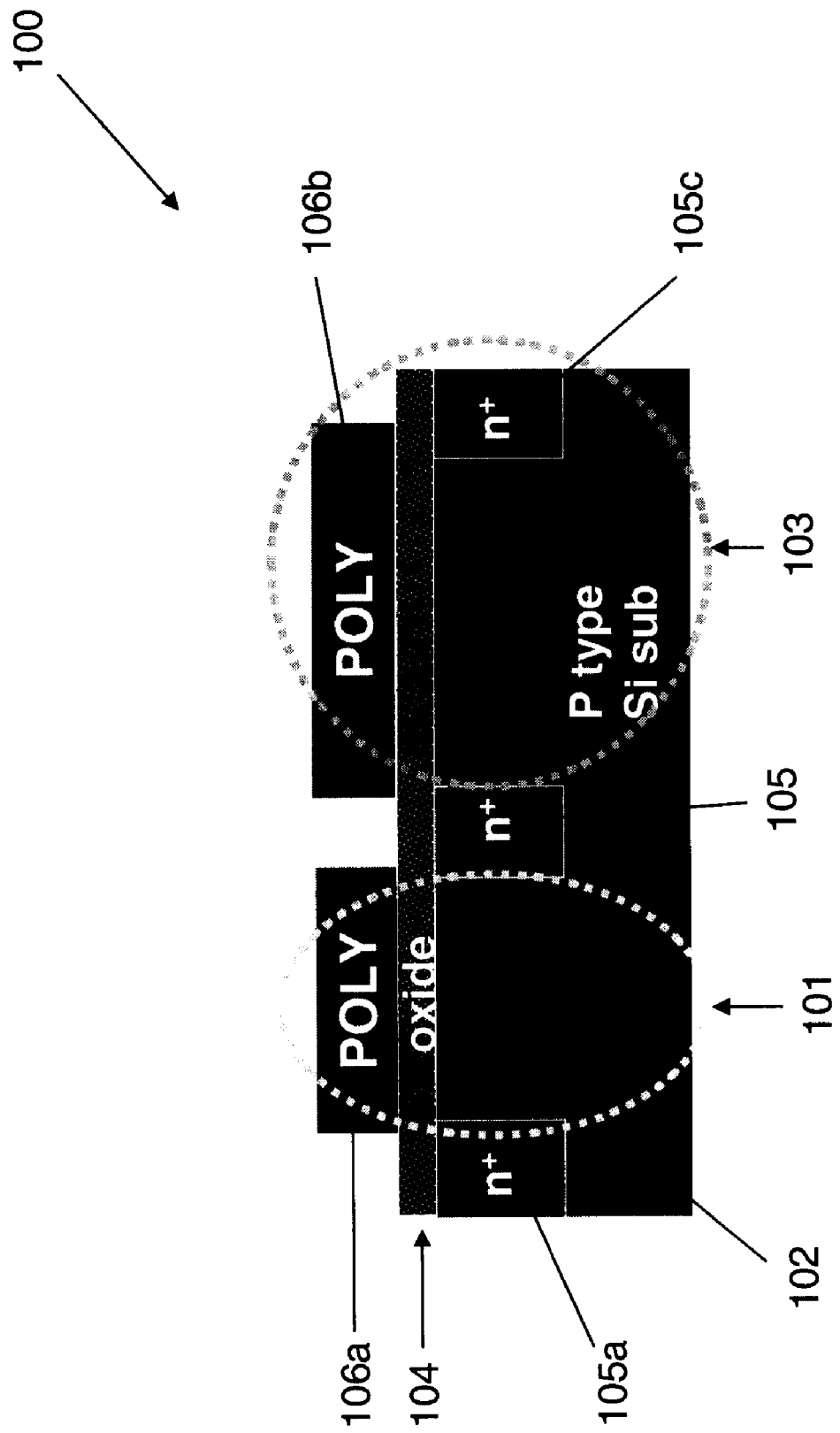
FIG. 1 illustrates the structure of a conventional planar capacitor DRAM.
Figure 2:
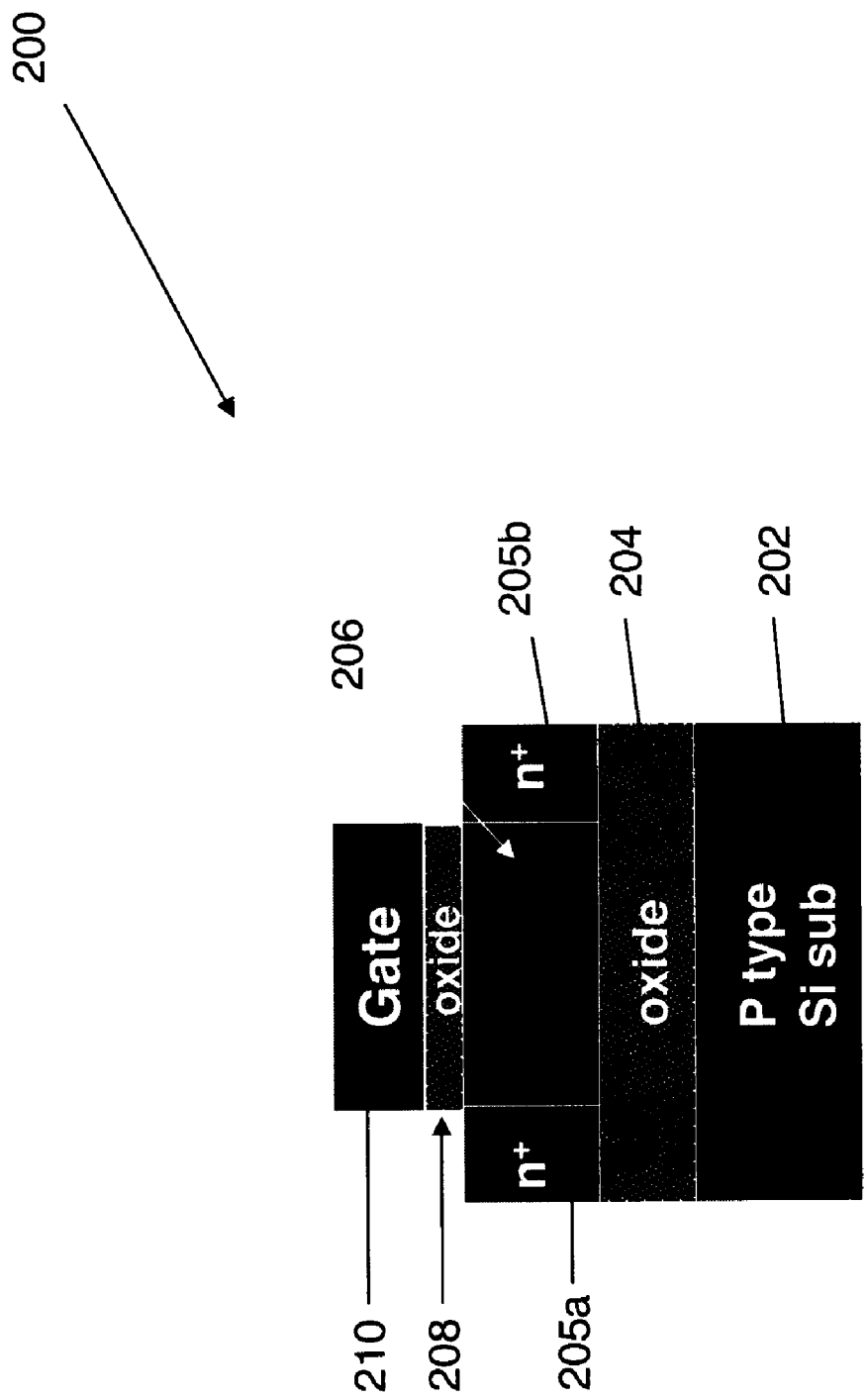
FIG. 2 illustrates the structure of a conventional silicon on insulator (SOI) trapping DRAM.
Figure 3:
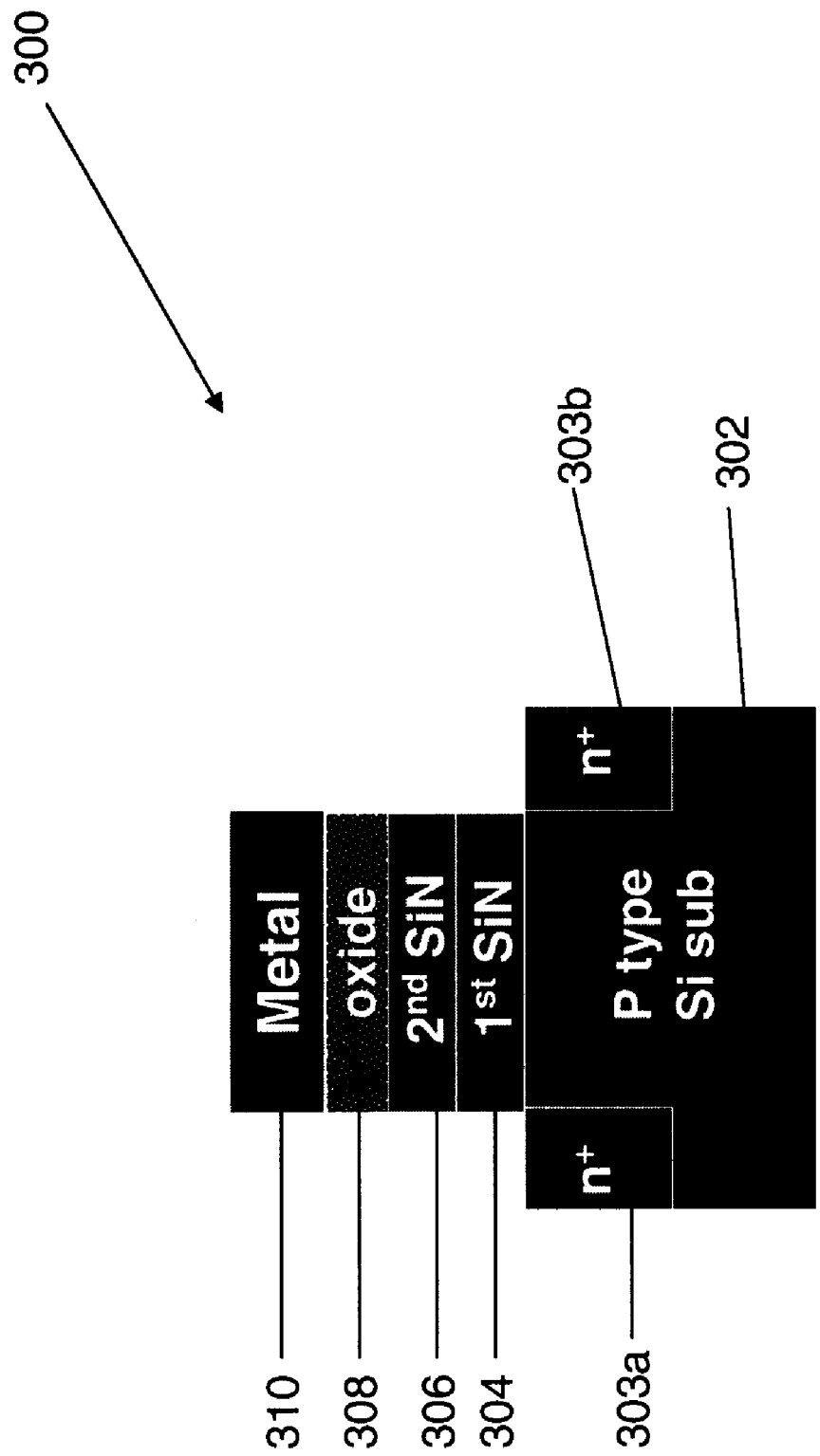
FIG. 3 illustrates a structure for a flash memory device.
Figure 4:
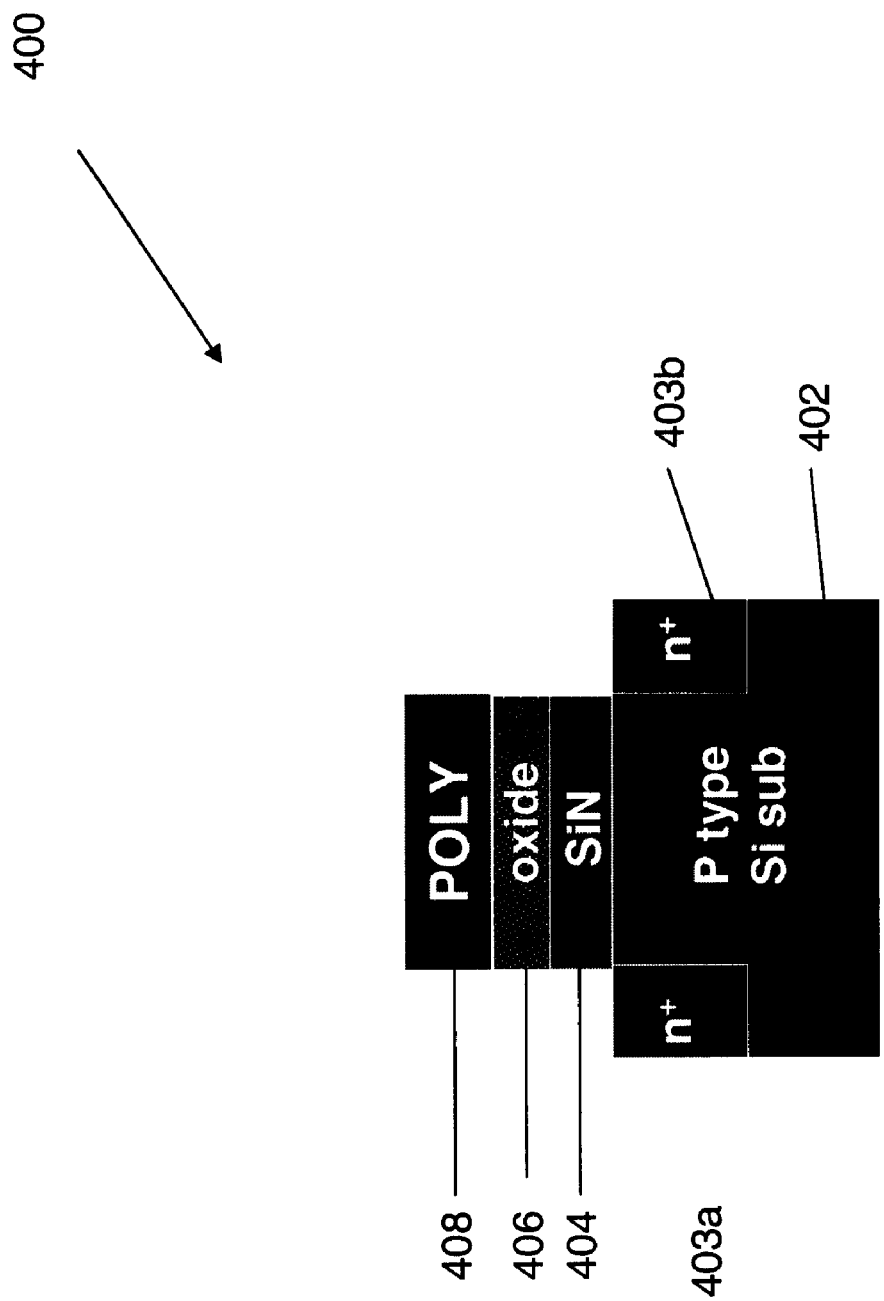
FIG. 4 illustrates one example of a multi-level-cell (MLC) trapping DRAM (TDRAM) structure.

FIG. 4 illustrates one example of a multi-level-cell (MLC) trapping DRAM (TDRAM) memory structure 400. The memory structure 400 includes a p-type substrate 402 having n+ dopant diffused areas 403 formed therein, which function as a source 403a and a drain 403b. A charge storage layer, shown here as nitride layer 404, such as silicon nitride (SiN), is formed over the p-type substrate 402. Alternatively, the charge storage layer may comprise a layer of, for example, Si rich SiN, Si rich SiON, Si rich SiOx, Ge rich GeON, Ge rich GeN, or Ge rich GeO. An insulating layer, shown here as oxide layer 406, is formed over the nitride layer 404. The oxide layer 406 may comprise, for example, $SiO_2$, $Si_3N_4$, $Al_2O_3$, $Hf_2O_3$, or other high-K block materials. A poly gate layer 408 is formed over the oxide layer 406, and functions as a control gate. In operation, the nitride layer 404 acts as a charge trapping and storage layer.

Figures 5A, 5B:
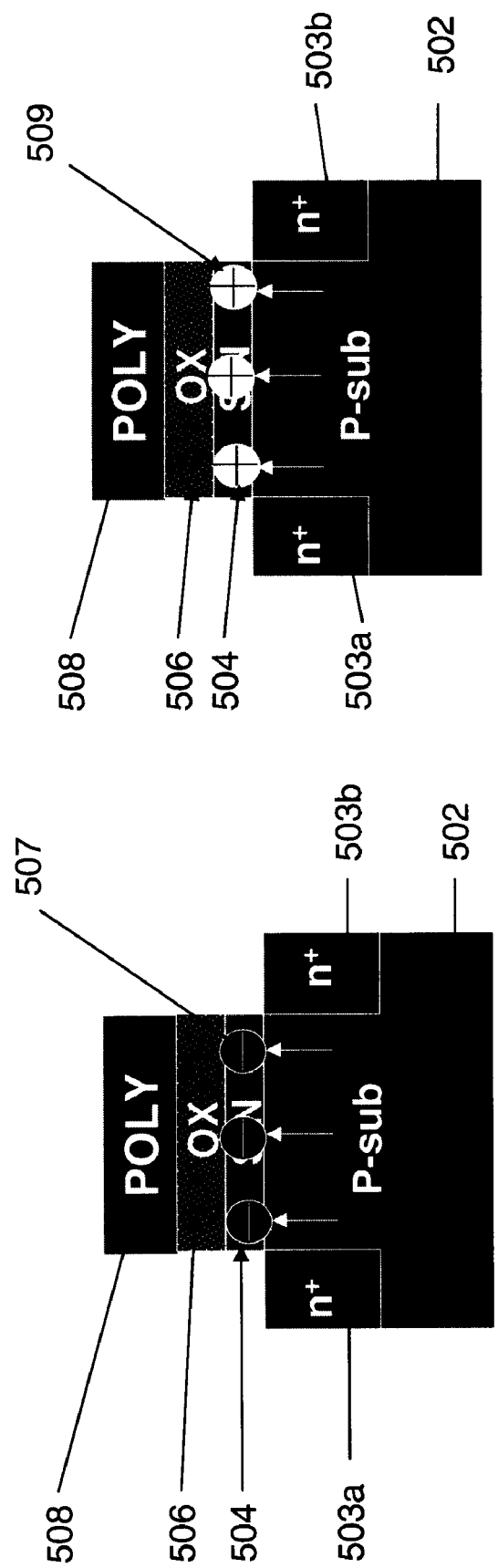
FIGS. 5A-5B illustrate examples of a memory device for programming and erasing a single-level-cell trapping DRAM.

Various operations for the memory device having a multi-level-cell trapping DRAM structure will now be described. FIGS. 5A-5B illustrate examples of a memory device for programming and erasing a single-level-cell trapping DRAM. In these examples, a memory device stores 1 bit per memory cell, corresponding to 2 different states: 0 and 1. In FIG. 5A, a data bit stored in the memory cell is programmed (i.e., the memory cell is programmed to the 0 state) by applying a control gate voltage Vg=18V along with a source 503a voltage Vs=0V, a drain 503b voltage Vd=0V, and a substrate 502 voltage Vsub=0V. In this way, electrons are injected from the drain 503b area into the charge storage layer, shown here as nitride layer 504, and are trapped. The oxide layer 506 acts as an insulator. The injection of electrons to the nitride layer 504 raises the threshold voltage Vt of the memory cell and programs the memory cell.

In FIG. 5B, the data bit is erased (i.e., the memory cell is erased to the 1 state) by applying a control gate voltage Vg=−18V along with a source 503a voltage Vs=0V, a drain 503b voltage Vd=0V, and a substrate 502 voltage Vsub=0V. In this way, holes are injected from the drain 503b area into the nitride layer 504 (i.e., electrons are removed). This lowers the threshold voltage Vt of the memory cell and erases it.

Figures 6A, 6B, 6C, 6D:
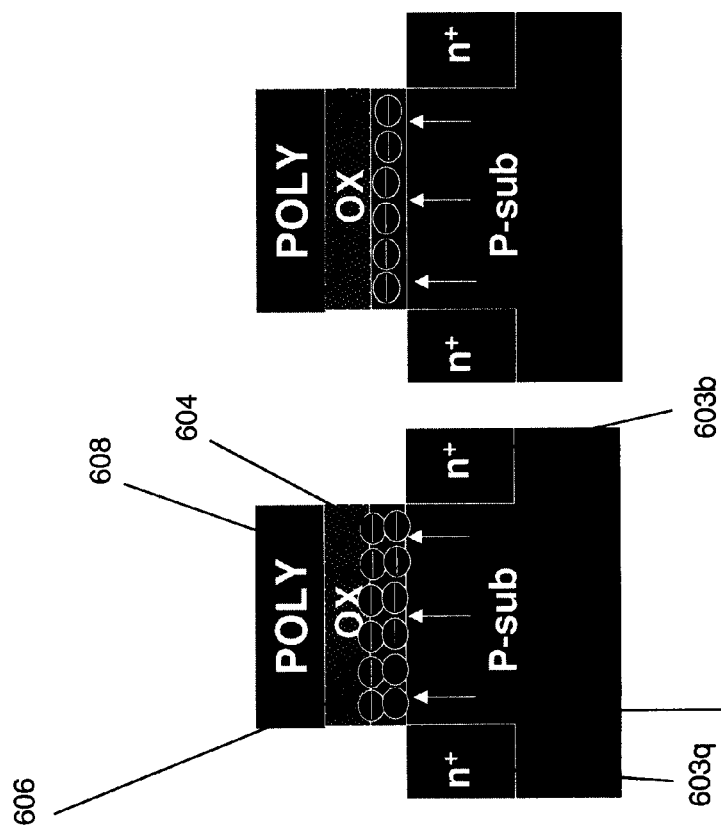
FIGS. 6A-6D illustrate examples of a memory device for programming and erasing a multi-level-cell trapping DRAM.

FIGS. 6A-6D illustrate examples of a memory device for programming and erasing a multi-level-cell trapping DRAM. In these examples, a memory device stores 2 bits per memory cell, corresponding to 4 different states: 00, 01, 10, and 11. In FIG. 6A, the memory cell is programmed to the 00 state by applying a control gate voltage Vg=20V along with a source 603a voltage Vs=0V, a drain 603b voltage Vd=0V, and a substrate 602 voltage Vsub=0V. In this way, electrons are injected from the drain 603b area into the charge storage layer, shown here as nitride layer 604, and are trapped. The oxide layer 606 acts as an insulator. The injection of electrons to the nitride layer 604 raises the threshold voltage Vt of the memory cell to a first level Vt1 and programs the memory cell to the 00 state.

In FIG. 6B, the memory cell is programmed to the 01 state by applying a control gate voltage Vg=18V along with a source 603a voltage Vs=0V, a drain 603b voltage Vd=0V, and a substrate 602 voltage Vsub=0V. In this way, electrons are injected from the drain 603b area into the nitride layer 604 and are trapped. The oxide layer 606 acts as an insulator. The injection of electrons to the nitride layer 604 raises the threshold voltage Vt of the memory cell to a second level Vt2 (lower than Vt1) and programs the memory cell to the 01 state.

In FIG. 6C, the memory cell is programmed to the 10 state by applying a control gate voltage Vg=16V along with a source 603a voltage Vs=0V, a drain 603b voltage Vd=0V, and a substrate 602 voltage Vsub=0V. In this way, electrons are injected from the drain 603b area into the nitride layer 604 and are trapped. The oxide layer 606 acts as an insulator. The injection of electrons to the nitride layer 604 raises the threshold voltage Vt of the memory cell to a third level Vt3 (lower than Vt1 and Vt2) and programs the memory cell to the 10 state.

In FIG. 6D, the memory cell is erased to the 11 state by applying a control gate voltage Vg=−18V along with a source 603a voltage Vs=0V, a drain 603b voltage Vd=0V, and a substrate 602 voltage Vsub=0V. In this way, holes are injected from the drain 603b area into the nitride layer 604 (i.e., electrons are removed). The injection of holes to the nitride layer 604 lowers the threshold voltage Vt of the memory cell to a fourth level Vt4 (lower than Vt1, Vt2, and Vt3) and erases the memory cell to the 11 state.

For the above examples of FIGS. 5A-5B and 6A-6D, a DRAM memory can include millions and even billions of memory cells arranged in arrays and blocks, along with word lines to access rows of memory cells and bit lines to access the charge storage layers and control gates during the program, erase, and read operations. Furthermore, other circuitry and logic (not shown) including sense amplifiers can be implemented with the above-described memory structure to perform such operations. Also, the same memory structure may be used in a non-volatile static RAM (SRAM) device.

Figure 7:
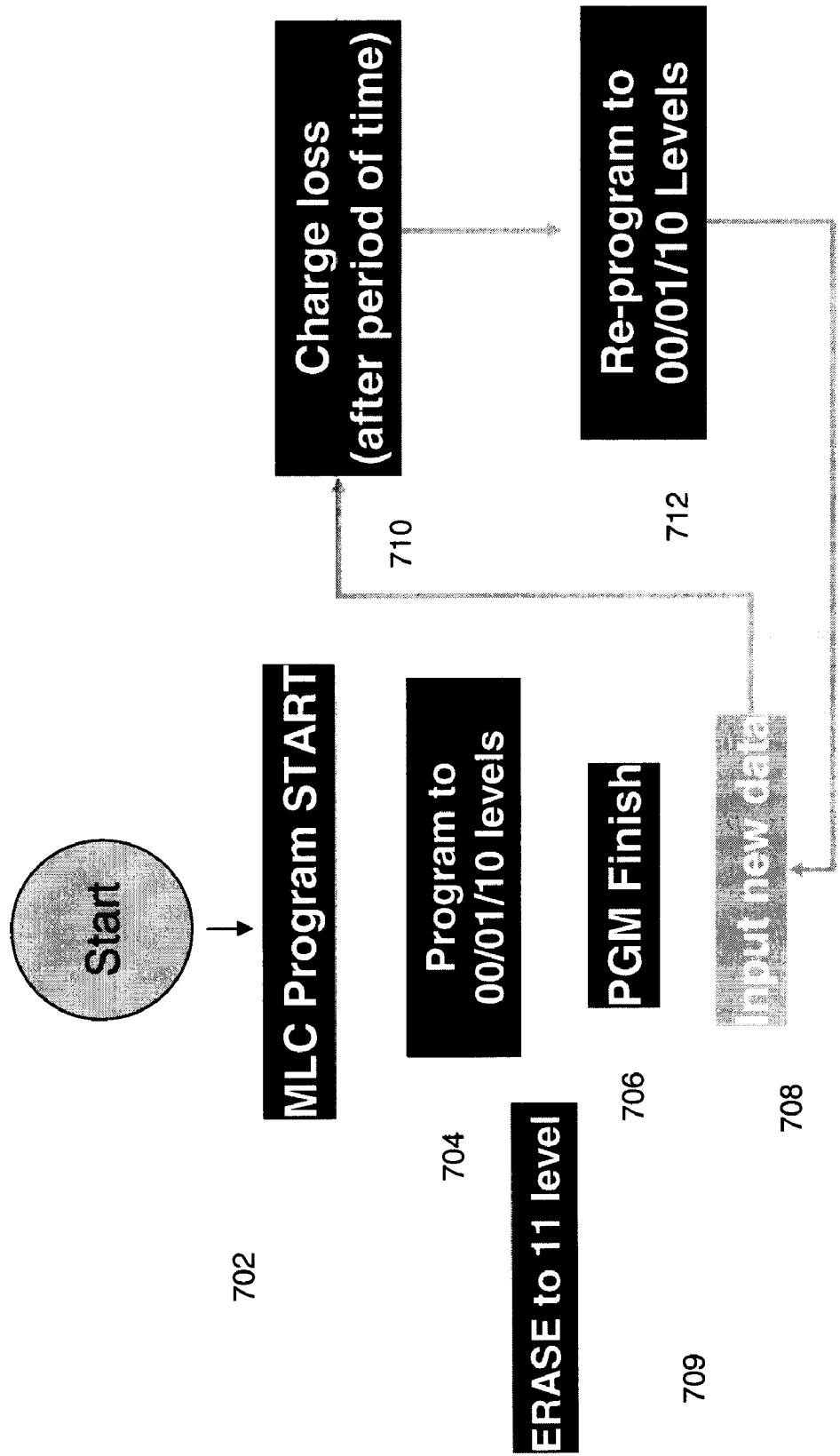
FIG. 7 is a flow diagram illustrating an example of a method for programming, refreshing, and erasing data in a multi-level-cell trapping DRAM.

FIG. 7 is a flow diagram illustrating an example of a method 700 for programming, refreshing, and erasing data in a multi-level-cell trapping DRAM. The method 700 begins with a program start, step 702. The cells are programmed to 00, 01, and 10 levels as in FIGS. 6A-6C, step 704. When all cells are programmed, the program finishes, step 706. A check is performed to determine if new data has been input, step 708. If so, the cells are erased to the 11 level as in FIG. 6D, step 709, and the method reverts to step 702. If not, then after a period of time there is a charge loss, step 710. The cells must then be reprogrammed to 00, 01, and 10 levels, step 712. The method then proceeds to step 709 and waits for new data.

FIG. 8 is a flow diagram illustrating an example of another method 800 for programming, refreshing, and erasing data in a multi-level-cell trapping DRAM. The method 800 begins with a program start, step 802. The cells are programmed to 00, 01, and 10 levels as in FIGS. 6A-6C, step 804. When all cells are programmed, the program finishes, step 806. A check is performed to determine if new data has been input, step 808. If so, the cells are erased to the 11 level as in FIG. 6D, step 809, and the method reverts to step 802. If not, then after a period of time there is a charge loss, step 710. The memory cells are erased to the 11 level, step 811. The cells must then be reprogrammed to 00, 01, and 10 levels, step 812. The method then proceeds to step 809 and waits for new data.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

I claim:

1. A method for making a multi-level cell trapping dynamic random access memory device comprising:
   forming source and drain areas in a substrate;
   forming a charge storage layer directly on the substrate, wherein the charge storage layer is a data storage layer storing n multiple bits, n is an integer, and the charge storage layer traps charge carriers injected by application of a voltage to set or reset a threshold voltage Vt of the memory cell to one of $2^n$ levels;
   forming an insulating layer over the charge storage layer; and
   forming a polysilicon layer over the insulating layer.

2. The method of claim 1, wherein forming the charge storage layer comprises forming one of silicon nitride, silicon oxynitride, silicon oxide, silicon dioxide, germanium nitride, germanium oxide, and germanium oxynitride.

3. The method of claim 1, wherein the polysilicon layer acts as a control gate.

4. The method of claim 1, wherein the insulating layer acts to prevent charge leakage from the charge storage layer.

5. The method of claim 1, wherein forming the insulating layer comprises forming a layer of one of $SiO_2$, $Si_3N_4$, $Al_2O_3$, and $Hf_2O_3$.

6. A multi-level cell trapping dynamic random access memory device comprising:
   a charge storage layer directly formed on a substrate and being a data storage layer storing n multiple bits, wherein n is an integer, and the charge storage layer traps charge carriers injected by application of a voltage to set or reset a threshold voltage $V_t$ of the device to one of $2^n$ levels;
   an insulating layer formed over the charge storage layer; and
   a polysilicon layer over the insulating layer.

7. The multi-level cell trapping dynamic random access memory device of claim 6, wherein the charge storage layer comprises one of silicon nitride, silicon oxynitride, silicon oxide, silicon dioxide, germanium nitride, germanium oxide, and germanium oxynitride.

8. The multi-level cell trapping dynamic random access memory device of claim 6, wherein the polysilicon layer acts as a control gate.

9. The multi-level cell trapping dynamic random access memory device of claim 6, wherein the insulating layer acts to prevent charge leakage from the charge storage layer.

10. The multi-level cell trapping dynamic random access memory device of claim 6, wherein the insulating layer comprises one of $SiO_2$, $Si_3N_4$, $Al_2O_3$, and $Hf_2O_3$.

11. A method of operating a trapping dynamic random access memory device having multi-level memory cells, the method comprising:
   selecting a multi-level memory cell, which
      includes a charge storage layer directly disposed on a substrate,
      is configured such that n multiple bits are stored in the charge storage layer, n is an integer, and the charge storage layer traps charge carriers injected by application of a voltage to set or reset a threshold voltage $V_t$ of the memory cell to one of $2^n$ multiple levels, and
      is controlled by a control gate;
   programming the memory cell to a first one of the $2^n$ multiple levels by applying a first voltage to the control gate; and
   reprogramming, after a period of time and a charge loss, the memory cell to the first one of the $2^n$ multiple levels to refresh the memory cell before the first one of the $2^n$ multiple levels is erased from the memory cell.

12. The method of claim 11, further comprising:
   erasing the memory cell by programming the memory cell to a second one of the $2^n$ multiple levels representing an erased state of the memory cell by applying a second voltage to the control gate.

13. The method of claim 12, further comprising:
   programming the memory cell to a third one of the $2^n$ multiple levels representing n multiple bits by applying a third voltage to the control gate.

* * * * *